US008868371B2

(12) United States Patent
Pelz et al.

(10) Patent No.: US 8,868,371 B2
(45) Date of Patent: Oct. 21, 2014

(54) METHOD AND DEVICE FOR DETERMINING TEST SETS OF OPERATING PARAMETER VALUES FOR AN ELECTRONIC COMPONENT

(75) Inventors: Georg Pelz, Ebersberg (DE); Thomas Nirmaier, Munich (DE)

(73) Assignee: Infineon Technologies AG, Neubiberg (DE)

( * ) Notice: Subject to any disclaimer, the term of this patent is extended or adjusted under 35 U.S.C. 154(b) by 365 days.

(21) Appl. No.: 13/228,504

(22) Filed: Sep. 9, 2011

(65) Prior Publication Data

US 2013/0066582 A1   Mar. 14, 2013

(51) Int. Cl.
*G01R 31/00* (2006.01)
*H01L 21/66* (2006.01)
*G01R 31/28* (2006.01)

(52) U.S. Cl.
CPC ............ *H01L 22/14* (2013.01); *G01R 31/2879* (2013.01); *H01L 22/20* (2013.01); *G01R 31/2894* (2013.01)
USPC ..................................... 702/123; 324/750.01

(58) Field of Classification Search
CPC ............................. G01R 31/00; G01R 31/2879
USPC ........................................................ 702/123
See application file for complete search history.

(56) References Cited

U.S. PATENT DOCUMENTS

| 6,487,700 | B1 | 11/2002 | Fukushima |
| 7,958,478 | B2 | 6/2011 | Saito et al. |
| 2002/0065624 | A1 | 5/2002 | Arnold et al. |
| 2011/0313710 | A1* | 12/2011 | Behzad et al. ............... 702/118 |

FOREIGN PATENT DOCUMENTS

| CN | 1784609 A | 6/2006 |
| CN | 101084446 A | 12/2007 |
| CN | 101311738 A | 11/2008 |
| CN | 101344898 A | 1/2009 |
| CN | 101359015 A | 2/2009 |
| CN | 101894219 A | 11/2010 |
| DE | 102004045204 A1 | 3/2006 |
| JP | 2000-267881 A | 9/2000 |
| WO | 2004-072670 A1 | 8/2004 |
| WO | 2006-068937 A2 | 6/2006 |

OTHER PUBLICATIONS

Christophe Andrieu et al. "An Introduction to MCMC for Machine Learning"; Kluwer Academic Publishers; Sep. 10, 2001 pp. 1-48.

(Continued)

*Primary Examiner* — Bryan Bui

(57) ABSTRACT

A method for determining test sets of operating parameter values for an electronic component, the method including: determining a first set of intermediate sets, each intermediate set containing a combination of a first number of operating parameters of the electronic component; determining a second set of reference sets, wherein the second set contains a union of sets, each set comprising all possible combinations of parameter values for the parameters of a respective intermediate set; selecting a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set.

25 Claims, 3 Drawing Sheets

(56) References Cited

OTHER PUBLICATIONS

Wikipedia: Elektronik. Version of Aug. 24, 2011 (date of research Apr. 24, 2014) http://de.wikipedia.org/w/index.php?title=Elektronik& solid=92835385> 6 pages.

Office Action dated Apr. 29, 2014 issued in corresponding German application No. 10 2012 108 407.6.

Keith Baker et al. "Shmoo Plotting: The Black Art of IC Testing" Philips ED&T Philips Research Laboratories, Eindhoven, The Netherlands Proceedings of the International Test Conference (ITC '96), 1996 IEEE pp. 1-2.

"Corner case" http://en.wikipedia.orgiwiki/Corner_case, downloaded from Internet Jan. 26, 2012 2 pages.

"Big O notation" http://en.wikipedia.orgiwiki/Big_O_notation, downloaded from Internet Jan. 26, 2012 39 pages.

"Computational complexity theory" http://en.wikipedia.orgiwiki/Computational_complexity_theory, downloaded from Internet Jan. 24, 2012 25 pages.

Office Action dated Aug. 5, 2014 issued in corresponding Chinese application No. 201210333550.6.

Li Rui-juan, "The Smallest Circuit Testing Collection Production Algorithm Based on Ant Group Algorithm", Journal of Liuzhou Vocational & Technical College, vol. 11 No. 2, Apr. 2011, Published in China, 5 pages including English Abstract.

\* cited by examiner

METHOD AND DEVICE FOR DETERMINING TEST SETS OF OPERATING PARAMETER VALUES FOR AN ELECTRONIC COMPONENT

BACKGROUND

When testing an electronic component during or after its manufacture, the testing procedure may involve corner testing. During a corner test, a device under test (DUT) is tested for its operability in situations, where several of its operating parameters are simultaneously at extreme levels, even though each of the values of the respective operating parameters lies within the specified range for that operating parameter. A corner case therefore corresponds to a problem or a situation which only occurs when several operating parameter values are "on the edge" of their rated range, i.e. when several operating parameters assume their corresponding minimally or maximally rated values (extreme values). Corner cases are often harder and more expensive to reproduce, test, and optimize because they require extreme configurations in multiple operating parameters. In addition to that, being guided by the belief that the chances for their product being operated at multiple simultaneous extreme settings is very slim, some manufacturers may tend be reluctant to test corner cases thoroughly.

Corner tests are often used in pre- and post-Si (silicon) verification of semiconductor devices to ensure functionality of the DUT under all constraints given by the specification, process variations and other deviations from nominal conditions. These tests are faced with the problems stated above and in addition, owing to the usually large number of operating parameters, they consume a lot of valuable testing time. Exhaustive or complete testing with 100% coverage of all corner cases involves testing and/or simulating the device under all possible combinations of minimum and maximum operating parameters. The number of such tests and/or simulations rises exponentially with the size of the verification space, i.e. the number of considered operating parameters of the device, and in consequence, so does the testing and/or simulation time. The test time can of course be reduced by incomplete testing which, however, may lead to undetected application failures. Monte Carlo tests may explore the full verification space but only reach 100% (average) coverage of all corner cases for an infinite number of tests and/or simulation runs.

SUMMARY

Various embodiments provide a method for determining test sets of operating parameter values for an electronic component which may generate compressed corner tests for large numbers of corner cases or corner conditions, e.g. a number between 1 and 100, and thereby may guarantee 100% coverage of corner cases or corner conditions in pre-Si simulation and/or post Si-testing within a feasible testing time.

According to various embodiments a method for determining test sets of operating parameter values for an electronic component is provided. The method may include: determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determining a second set of reference sets, wherein the second set contains a union of sets, each set including all possible combinations of parameter values for the parameters of a respective intermediate set; selecting a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Figure 1:
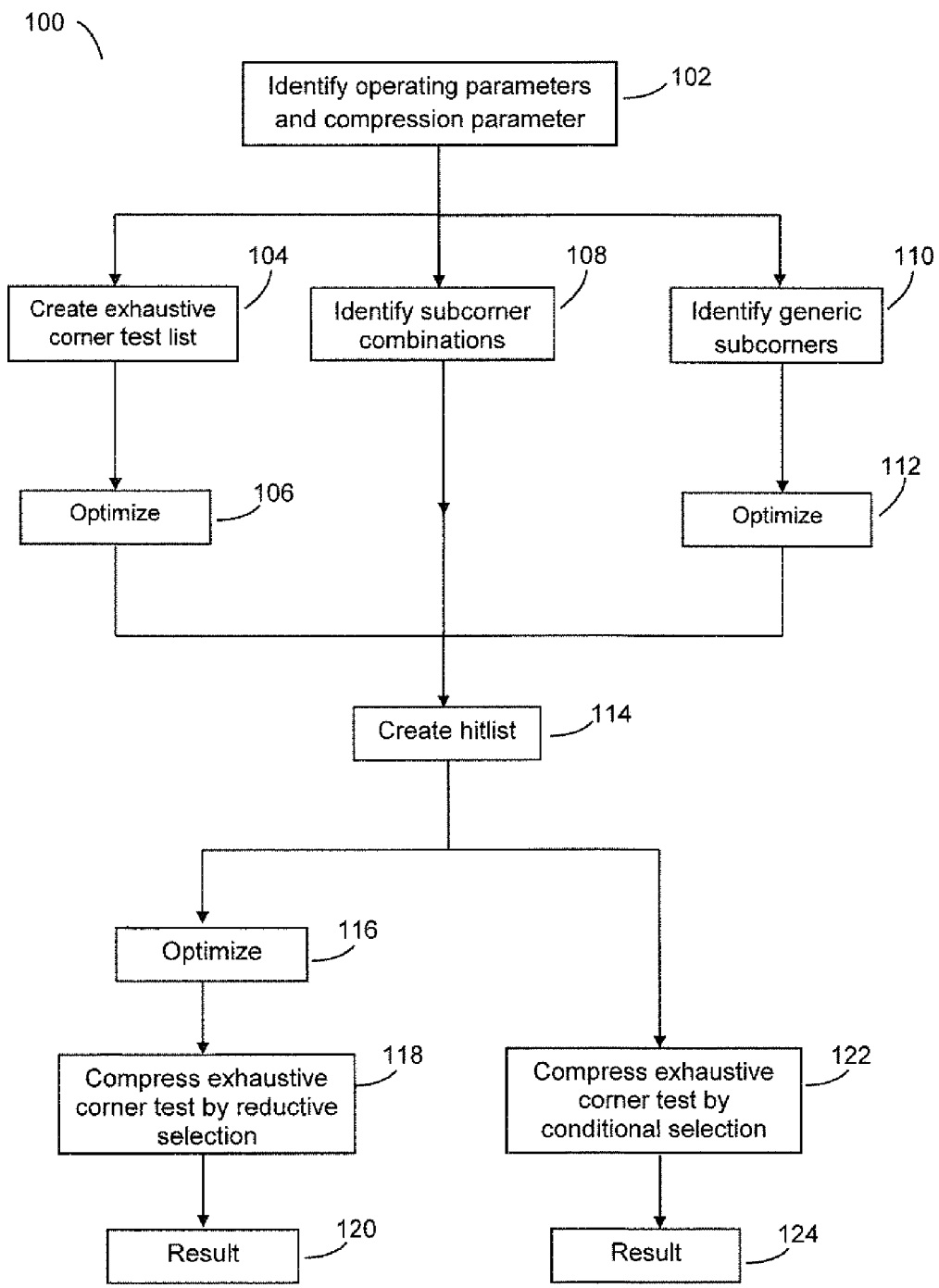
FIG. 1 shows a flow diagram of the method for determining test sets of operating parameters for an electronic component according to various embodiments.

The following detailed description refers to the accompanying drawings that show, by way of illustration, specific details of various embodiments of the method and device for determining test sets of operating parameters of an electronic component.

The word "exemplary" is used herein to mean "serving as an example, instance, or illustration". Any embodiment or design described herein as "exemplary" is not necessarily to be construed as preferred or advantageous over other embodiments or designs.

According to various embodiments of the method for determining test sets of operating parameter values for an electronic component, a set of corner tests for a given set of corner cases or corner conditions and for a given compression may be generated, wherein the number of corner tests in the set may be minimized and the coverage of corner cases may be maximized within a feasible test and/or simulation time. In the following description, the term "test" shall entail both an actual post-Si (post-silicon) hardware test as well as a pre-Si (pre-silicon) simulation.

The term compression as used above may denote the reduction of an exhaustive corner test including testing of all possible corner cases or corner conditions to a reduced or compressed set of corner cases or corner conditions which may be tested in the end and provide sufficient information about a behaviour of the DUT in corner cases or corner conditions.

In the following, the method for determining test sets of operating parameters for an electronic component according to various embodiments will be described on the basis of the flow diagram 100 shown in FIG. 1. In addition, mainly for purposes of a better understanding, an exemplary case will be presented. However, it is pointed out that the exemplary case is only one of very many possible scenarios and it is therefore not to be laid out in an restrictive manner.

According to various embodiments, the method for determining test sets of operating parameter values for an electronic component may begin with 102 in which operating parameters to be examined and a compression parameter d may be identified, the number of the selected operating parameters being D. The operating parameters may be freely chosen and may correspond to the operating parameters of an electronic device which a manufacturer may want to scrutinize with respect to their influence in corner conditions or in corner cases on the electronic device. The compression parameter d may correspond to a dimension of each one of subcorner conditions or subcorners into which a respective corner condition from the exhaustive corner test may be subdivided into.

In other words, a corner case in the exhaustive corner test including, for example, D=4 operating parameters having certain distinguished values, e.g. a minimum value and a maximum value, may be subdivided into six two-dimensional corner conditions, six being the number of combinations of d=2 elements drawn from a set of D=4 elements where order is irrelevant. The number of combinations corresponds to the binominial coefficient D choose d, in this example 4 choose 2, which is equal to 6. Therefore, the corner compression parameter d may illustratively be seen as the dimension of any of the subcorners into which a corner case or corner condition as present in the exhaustive corner test may be subdivided into.

In general, every operating parameter may have a number k of distinct operating parameter values. Typically, the number k may be equal to 2 and the respective operating parameter may then assume two operating parameter values, for example a minimum (rated) operating parameter value and a maximum (rated) operating parameter value. However, k may be equal to any other number, for example k=3, such that in addition to a maximum and a minimum value, a nominal operating parameter value may be further assumed by the respective operating parameter.

In Table 1 shown below, an exemplary set of four operating parameters of an electronic device is listed which will serve as an example throughout the description. In this example, D=4 operating parameters may be selected for the exhaustive corner test and may correspond to, for example, a supply voltage $V_{dd}$, a frequency f, a temperature T and a signal input level $V_{in}$. In other embodiments, any other suitable parameter may be used. Furthermore, in various embodiments, an arbitrary number of operating parameters may be used, e.g. more than four, e.g. five, six, seven, eight, nine, ten, eleven, or even more. Furthermore, it is to be emphasized that the benefits of using the method according to various embodiments may increase with a growing number of operating parameters as will be demonstrated later on in connection with FIG. 1. It is possible that with a small number of parameters, for example D=4, a solution to the problem of determining a compressed test from an exhaustive corner test may be found without using algorithmic help. In the chosen scenario which will serve as an example throughout this description, a rather small number of operating parameters D=4 has been chosen for reasons of illustration. The four parameters are listed in a first column of Table 1. However, since the operating parameter choice is arbitrary, generalized operating parameters, which are listed in a second column of Table 1, will be used in the following. In a third column of Table 1, an exemplary minimum value of each of the actual operating parameters is given and in a fourth column their generalization which will be used in the following is listed. As can be seen from comparison of the third column to the fourth column of Table 1, a minimum value of an operating parameter may be denoted in an abstract way by "0". In a fifth column of Table 1 a maximum value of each of the actual operating parameters is listed, in a sixth column its generalization which will be used in the following is listed. As can be seen from comparison of the fifth column to the sixth column, a maximum value of an operating parameter may be denoted in an abstract way by "1". As already mentioned, instead of the maximum and minimum rated values, any other constant value may be used. In this example, every operating parameter may assume k=2 operating parameter values, which in this case may be the corresponding maximum (rated) operating parameter value and minimum (rated) operating parameter value. The use of generalized operating parameters together with generalized minimum and generalized maximum values enables the task of compressing the exhaustive corner test to be expressed and solved more easily and efficiently in terms of matrices.

TABLE 1

Exemplary operating parameters of interest

| Operating parameter | Generalized Operating parameter | Minimum value | Generalized minimum value | Maximum value | Generalized maximum value |
| --- | --- | --- | --- | --- | --- |
| $V_{dd}$ | A | 3 V | 0 | 12 V | 1 |
| f | B | 10 MHz | 0 | 100 MHz | 1 |
| T | C | −40° C. | 0 | 160° C. | 1 |
| $V_{in}$ | D | 0 V | 0 | 5 V | 1 |

After the operating parameters of a given electronic component which are to be considered and the compression parameter d have been established, a process aiming at a generation of a hitlist may be initiated. The following processes, namely 104, 106 and 110 may be performed in parallel or in sequence.

In 104, an exhaustive corner test list on the basis of the D chosen operating parameters may be established. The exhaustive test list, e.g. corner test list, may contain all possible combinations of the operating parameter values qualifying as a test condition, e.g. as a corner condition. The number of test runs in the exhaustive corner test corresponds to $k^D$ since each of the D operating parameters may assume any of its k operating parameter values. The exhaustive corner test may be represented by a matrix having D columns and $k^D$ rows, each column representing an operating parameter and each row representing a test run with a different combination of operating parameter values for each of the operating parameters. In Table 2, the exhaustive corner test for the exemplary case of D=4 operating parameters (cf. Table 1) is presented. As can be seen, there are $k^D=2^4=16$ different corner cases or corner conditions to be covered in the exhaustive test. The exhaustive test matrix in this example would include the array formed by Table 2 without the first row and the first column (as they are only used for labelling). It goes without saying that the content of Table 2 would vary with a different number of test conditions, e.g. with a different number of corner conditions, and/or with a different number of operating parameters being taken into account.

TABLE 2

Exemplary exhaustive corner test list

| Test number | Value of A | Value of B | Value of C | Value of D |
| --- | --- | --- | --- | --- |
| 1 | 0 | 0 | 0 | 0 |
| 2 | 0 | 0 | 0 | 1 |
| 3 | 0 | 0 | 1 | 0 |

TABLE 2-continued

Exemplary exhaustive corner test list

| Test number | Value of A | Value of B | Value of C | Value of D |
|---|---|---|---|---|
| 4 | 0 | 0 | 1 | 1 |
| 5 | 0 | 1 | 0 | 0 |
| 6 | 0 | 1 | 0 | 1 |
| 7 | 0 | 1 | 1 | 0 |
| 8 | 0 | 1 | 1 | 1 |
| 9 | 1 | 0 | 0 | 0 |
| 10 | 1 | 0 | 0 | 1 |
| 11 | 1 | 0 | 1 | 0 |
| 12 | 1 | 0 | 1 | 1 |
| 13 | 1 | 1 | 0 | 0 |
| 14 | 1 | 1 | 0 | 1 |
| 15 | 1 | 1 | 1 | 0 |
| 16 | 1 | 1 | 1 | 1 |

As indicated by Table 2, for only D=4 chosen operating parameters, where each one may assume k=2 operating parameter values, the table (or matrix) already contains 16 individual test runs. The number of test runs to be conducted in the exhaustive corner test grows exponentially with the number of chosen operating parameters D and becomes unfeasibly large for D greater or equal to 6 such that the exhaustive corner test may then practically not applicable to the electronic component owing to the amount of test time, for example.

In 108, subcorner combinations related to the parameter space spanned by the D chosen operating parameters may be identified. The subcorner combinations may be d-dimensional and they may correspond to different combinations including d operating parameters out of the D operating parameters. Thus, the number of possible subcorner combinations formed from the D operating parameters is (D choose d), as previously explained. The subcorner combinations may be represented by a matrix which has d columns and (D choose d) rows, each column representing one of the d operating parameters of a subcorner combination and each row representing a different combination of the d operating parameters which are included in a subcorner.

Returning back to the exemplary case, (D choose d)=(4 choose 2)=6 different subcorner combinations may be formed on the basis of the 4 chosen operating parameters. In Table 3, the six pairs of operating parameters defining subcorner combinations in the given example are listed. Here, the order of the first operating parameter and the second operating parameter of a respective subcorner is irrelevant such that they may be switched without having any effect on the presented method. Table 3 may be regarded as a matrix (if the first row and the first column of Table 3 are omitted), each of the two columns representing an operating parameter of a respective subcorner combination and each row representing a different one of the six subcorner combinations.

TABLE 3

Exemplary set of subcorner combinations

| Subcorner | First operating parameter | Second operating parameter |
|---|---|---|
| 1 | A | B |
| 2 | A | C |
| 3 | A | D |
| 4 | B | C |
| 5 | B | D |
| 6 | C | D |

In 110, generic subcorners may be identified. A generic subcorner may correspond to a combination of operating parameter values in a subcorner combination. Each of the subcorner combinations identified in step 108 may generate subcorners, when the corresponding operating parameters each assume one of their k operating parameter values. By mapping a generic subcorner on each of the subcorner combinations as defined in 108, $k^d$ subcorners may be established on the basis of the respective subcorner combination. In various embodiments, it is assumed that every operating parameter has the same number k of operating parameter values it may assume. Alternatively, however, different operating parameters may have different numbers of operating parameters they may assume. For example, one of the D operating parameters may have 3 operating parameter values whereas all the other D−1 operating parameters may have 2 operating parameter values. In regular cases, where all operating parameters have the same number of k operating parameter values, a matrix representing a generic subcorner may include d columns and $k^d$ rows, each column representing one of the d operating parameters and each row representing a different generic subcorner.

In the exemplary scenario of D=4 operating parameters each having k=2 operating parameter values where the compression parameter is chosen to be d=2 (simultaneously denoting the dimension of the subcorners), there are $k^d=2^2=4$ generic subcorners, namely the four possibilities to arrange a minimum (rated) operating parameter value and a maximum (rated) operating parameter value in pairs, as shown in Table 4. Again, by omitting the first row and the first column of Table 4 a corresponding matrix representation may be obtained. It is to be noted that in this case the combinations may in fact be permutations, as the situation of the first operating parameter, for example A, assuming a minimum operating parameter value and the second operating parameter, for example B, assuming a maximum operating parameter value is not equivalent to the first operating parameter, for example A, assuming a maximum operating parameter value and the second operating parameter, for example B, assuming a minimum operating parameter value.

TABLE 4

Exemplary set of generic corners

| Subcorner | First operating parameter | Second operating parameter |
|---|---|---|
| 1 | 0 | 0 |
| 2 | 0 | 1 |
| 3 | 1 | 0 |
| 4 | 1 | 1 |

In 114, the hitlist may be generated. The hitlist may be a table or a matrix containing information about which subcorner may be covered by which test run in the exhaustive corner test. The hitlist may be based on the results obtained from the previous steps, i.e. on the exhaustive test list obtained in 104, on the subcorner combinations obtained in 108 and on the generic subcorners obtained in 110.

Before the generation of the hitlist in 114, an optimization 106 may be performed after 104 and/or an optimization 112 may be performed after 110, wherein both optimization steps are optional steps. Both optimization processes may be the same and may rely on the fact that, as can be shown mathematically, a minimal optimal number of tests which needs to be considered in 104 and/or in 110 is $$\cong (D-d+1)\cdot 2^d \cdot \frac{d}{D}$$

It is to be noted that the formula only gives an approximation of the number of tests in the compressed test, it does not yield the respective tests or test runs in a compressed test.

Therefore, in order to break the factorial complexity of the hitlist generation, only $n_{opt}$ tests may be evaluated or only $n_{opt}$ subcorner combinations may be used for further calculations. In other words, in 106 only $n_{opt}$ out of $k^D$ tests contained in the exhaustive corner test list (cf. Table 2) may be selected randomly and considered for further calculations and/or in 112 only $n_{opt}$ subcorner combinations from the (D choose d) subcorner combinations may be selected randomly and considered for further calculations. The optimization processes 104 and 112 simplify the overall algorithm and decrease its complexity to O(D) (the O( ) denotes the big O notation commonly used in mathematics). The inclusion of the optimization steps 106 and 112 may provide a good approximation to the optimal solution, however, a 100% (average) coverage of the corner cases or corner conditions is then only approximated. Both optimization steps lead to typically 20% larger number of tests to be performed as compared to the optimal solution.

In the exemplary scenario of D=4 operating parameters each having k=2 operating parameter values where the compression parameter is chosen to be d=2, the optimal number $n_{opt}$ amounts to 6. Therefore, in the optimization process 106, 6 out of 16 test runs from the exhaustive test list (cf. Table 2) may be selected and evaluated.

The hitlist generated in 114 may be a matrix or a table correlating each of the subcorners, i.e. subcorner combinations, wherein each of the operating parameters of the respective subcorner assumes one of the k possible operation parameter values, with a test from the exhaustive corner test list. The matrix may therefore have $k^d$ columns and $k^d \cdot$(D choose d) rows, wherein each row may represent a different subcorner and may contain the test runs from the corresponding exhaustive test list in which the respective subcorner is contained. The hitlist may be the main driver for computational complexity of the overall algorithm, which may be reduced by the optimization processes 106 and 112 described above which in effect reduce the amount of data on the basis of which the hitlist may be determined.

In the exemplary scenario of D=4 operating parameters each having k=2 operating parameter values where the compression parameter is chosen to be d=2, there are $k^d \cdot$(D choose d)=4·6=24 different subcorners. In other words, the 6 different subcorner combinations (cf. Table 3) each having 4 generic subcorners (cf. Table 4) give rise to 24 different subcorners. In Table 5, only the first five entries and the last entry of the table (or matrix) representing the hitlist are shown. In the first row of the Table 5, all test runs from the exhaustive corner test list (cf. Table 2) are listed which contain the combination of parameter A having a minimum value, denoted by A[0], and parameter B having a minimum value, denoted by B[0]. In the second row of the Table 5, all test runs from the exhaustive corner test list (cf. Table 2) are listed which contain the combination of parameter A having a minimum value, denoted by A[0], and parameter B having a maximum value, denoted by B[1]. In the third row of the Table 5, all test runs from the exhaustive corner test list (cf. Table 2) are listed which contain the combination of parameter A having a maximum value, denoted by A[1], and parameter B having a minimum value, denoted by B [0]. In the fourth row of the Table 5, all test runs from the exhaustive corner test list (cf. Table 2) are listed which contain the combination of parameter A having a maximum value, denoted by A[1], and parameter B having a maximum value, denoted by B [1]. The first four rows of the hitlist table (or matrix if the first row and the first column, both used for labelling, are omitted) cover all possible subcorners which may be obtained from the subcorner combination of the operating parameters A and B (cf. first row of Table 3). In an analogous manner, the next four rows (only two are shown) cover all possible subcorners which may be obtained from the subcorner combination of the operating parameters A and C (cf. first row of Table 3). Note that this is only one of very many possible instances of the hitlist matrix (or table) and the hitlist matrix (or table) is not restricted to this form as the ordering of the subgroups of the corner combinations or the ordering of the subcorners within a subcorner combination is arbitrary and may therefore may be freely chosen.

TABLE 5

Exemplary hitlist

| | Subcorner | Number of test in exhaustive test list containing that subcorner | | | |
|---|---|---|---|---|---|
| 1 | (A[0], B[0]) | 1 | 2 | 3 | 4 |
| 2 | (A[0], B[1]) | 5 | 6 | 7 | 8 |
| 3 | (A[1], B[0]) | 9 | 10 | 11 | 12 |
| 4 | (A[1], B[1]) | 13 | 14 | 15 | 16 |
| 5 | (A[0], C[0]) | 1 | 2 | 5 | 6 |
| . | . | . | . | . | . |
| . | . | . | . | . | . |
| 24 | (C[1], D[1]) | 4 | 8 | 12 | 16 |

The hitlist generated in 114 is used for the selection process which will be described in the following. Speaking in general terms, the selection process which may be performed on the basis of the hitlist aims at selecting a number of test runs from the exhaustive test list (cf. Table 2) such that all subcorners contained in the hitlist are covered by those selected test runs. In the following, two exemplary ways to implement the selection process will be described.

In 118, the first test run from the exhaustive test list may be selected and placed into a result list. All subcorners contained in the selected first test run may then be removed from the hitlist. This procedure may be performed iteratively until all subcorners have been "hit". In other words, the test run in the exhaustive test list may selected, placed in the result list and the subcorners contained in that test run may be removed from the hitlist until all subcorners are covered by the test runs contained in the result list. Said differently, the original exhaustive test list may be compressed reductively into the result list by selecting a number of the first test runs from the exhaustive test list, such that all subcorners may be reached by the test runs contained in the result list. Alternatively, the test runs from the exhaustive corner test list may be selected randomly. That is, instead of selecting a number of the first test runs listed in the exhaustive test list, the test runs from the exhaustive corner test list may be chosen randomly. After every random selection of a test run, the subcorners contained in that test run may be removed from the hitlist. Finally, in 120, the resulting test list may be obtained which may form the basis for an optimized corner test of the DUT.

An optional optimization 116 may be performed before the compression is performed in 118. In 116, the original exhaustive corner test list (cf. Table 2) may be randomly permuted with respect to the rows. A permutation of the rows of the exhaustive test list may break the symmetry of the exhaustive corner test list and therefore improve the efficiency of the overall algorithm, for example decrease the required runtime. The symmetry of the exhaustive corner test list may lead to worst case size test lists, i.e. resulting test lists with a number of test runs which is bigger than the number of test runs contained in an optimally resulting test list.

Alternatively, the compression process of the exhaustive test list may just as well be performed in 122 by selective compression. In the selective compression process, any test run from the exhaustive test list may be selected. That test run may then be removed from the exhaustive test list and placed in the result list and subcorners covered by that test run may be removed from the hitlist. Then, the number of subcorner hits for each of the test runs remaining in the exhaustive test list may be identified, whereupon the test run from the exhaustive corner test list which covers a maximum number of subcorners still present in the hitlist may be selected and added to the result list, subcorners hit by that test run may be removed from the hitlist. This process may also be executed iteratively, until all subcorners have been removed from the hitlist. Here, the term selective compression indicates that at each step of the selective compression process, the best test run is selected form the exhaustive test list, i.e. the test run containing or including the biggest number of subcorners still present in the hitlist. The algorithm just described may be accelerated computationally if used in combination with the optimization 106 and 112 which may be performed during the preparation of the hitlist, as described above. Finally, the resulting test list is obtained in step 124 once all subcorners have been removed from the hitlist.

Table 6 shows an exemplary set of test runs from the exhaustive test list (cf. Table 2) which may be obtained from the method for determining test sets of operating parameter values for an electronic component according to various embodiments. The result list shown in Table 6 is based on the exemplary scenario of D=4 operating parameters each having k=2 operating parameter values where the compression parameter is chosen to be d=2. As can be seen, only 6 tests or test runs may be needed in order to conduct a corner test which covers all possible two-dimensional (d=2) subcorners. In practice, exhaustive testing is impractical if the number of test runs exceeds 6. With the method and device according to various embodiments it is therefore possible to reduce (or "compress") the large number of tests in an exhaustive corner test to a small number of tests in the result list or resulting set of test runs.

TABLE 6

Exemplary result list after corner compression

| Test number | Value of A | Value of B | Value of C | Value of D |
|---|---|---|---|---|
| 1 | 0 | 0 | 0 | 0 |
| 2 | 0 | 1 | 1 | 1 |
| 3 | 1 | 0 | 0 | 1 |
| 4 | 1 | 1 | 1 | 0 |
| 5 | 0 | 0 | 1 | 0 |
| 6 | 0 | 1 | 0 | 0 |

The idea behind the compression may be seen in an heuristic approach that already a small number of operating parameters, for example two parameters, having extreme values may be sufficient to trigger a faulty behaviour of the device. This assumption may be seen as motivation for breaking up a corner case or corner condition into subcorners.

Figure 2:
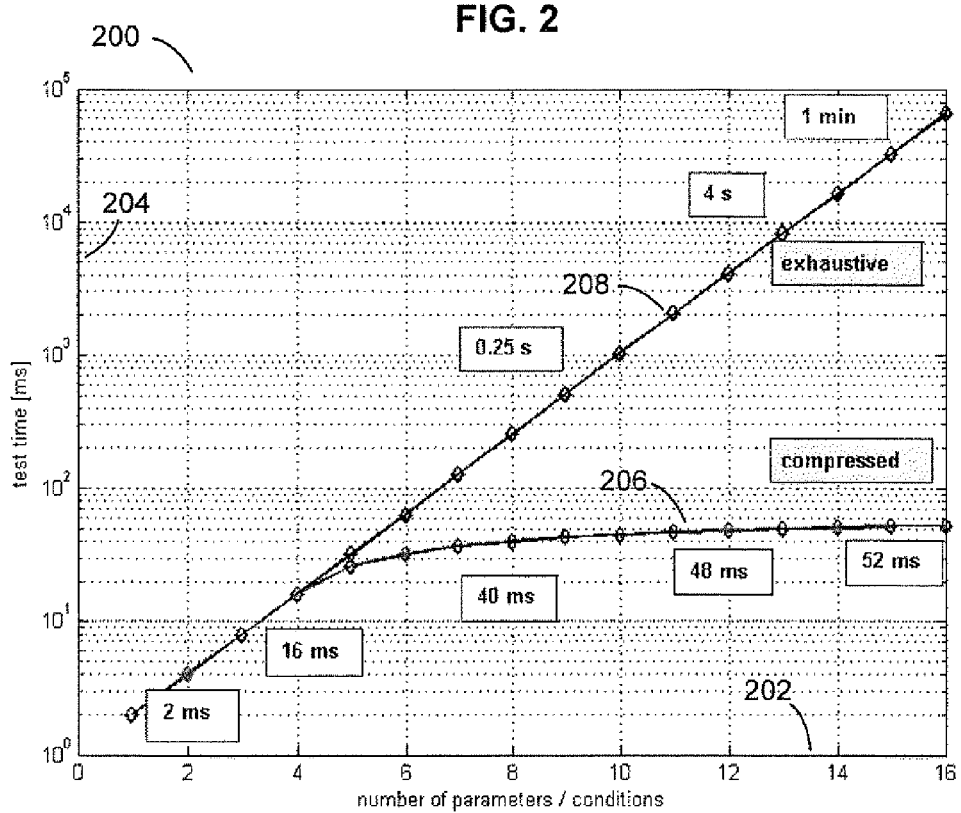
FIG. 2 shows a comparison of the test time of an exhaustive corner test and a compressed corner test in accordance with various embodiments.

In diagram 200 of FIG. 2, the test time of an exhaustive test, represented by graph 208, is compared to the test time of a compressed test, represented by graph 206. The x-axis 202 denotes the number of operating parameters D and the y-axis 204 denotes the test time in milliseconds. For the compressed test based on the test runs contained in the result test lists obtained in 120 or 124 in diagram 100 in FIG. 1 the DUT may be subject to, a compression factor of d=4 is assumed. It is further assumed that a single test run (simulation or actual measurement) takes 1 millisecond. The comparison of both graphs shows that the test time for exhaustive tests grows exponentially (note the logarithmic scaling of the y-axis 202) with a growing number of operating parameters, whereas the test time for a compressed test determined according to the method for determining test sets of operating parameter values for an electronic component in accordance with various embodiments grows approximately linearly up to D=4 and then approximately shows a saturation for greater D, i.e. D>4. For D=14, for example, the compressed test approximately consumes 20 times less time than the corresponding exhaustive test.

Figure 3:
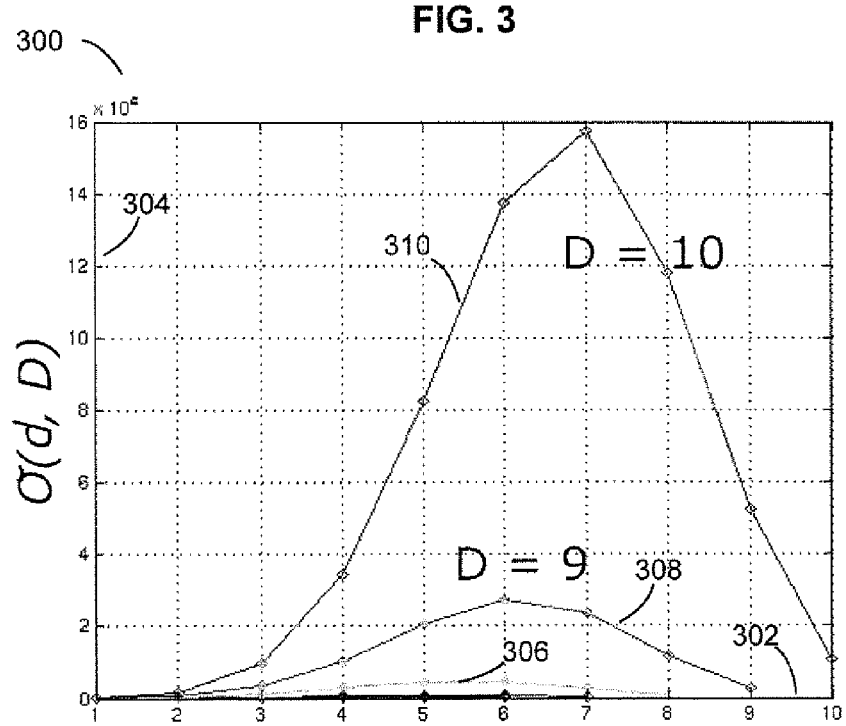
FIG. 3 shows the dependence of the order of the algorithm on input parameters.

In FIG. 3, the general motivation for the application of the method for determining test sets of operating parameter values for an electronic component in accordance with various embodiments is presented. Diagram 300 in FIG. 3 shows the dependence of the computational order of the algorithm for compressing an exhaustive corner test, denoted by the y-axis 304 of diagram 300, on the compression parameter d, denoted by the x-axis 302 of the diagram 300. The order of the algorithm denotes the number of possible combinations that are to be considered when identifying subcorner combinations in 108 of the flow diagram 100 in FIG. 1. A first graph 306 represents the order of the algorithm with D=8 as the number of operating parameters, a second graph 308 represents the order of the algorithm with D=9 as the number of operating parameters and a third graph 310 represents the order of the algorithm with D=10 as the number of operating parameters. It can be clearly seen that the order of the algorithm increases with a growing number of operating parameters to be considered. However, the impact of a growing compression parameter d seems to be greater. It can be seen the maximum of each graph grows rapidly for a given number of operating parameters D. Overall, the order of the algorithm can reach values beyond $10^6$ for numbers of operating parameters below 10. It can be shown that the number of possible combinations of d operating parameters selected from a predefined operating parameter set containing D operating parameters lies in the order of $$o\left(2^{d+D} \cdot \binom{D}{d}\right).$$

Since the exponential part of the term is continuously growing it can be deduced that the factor being substantially responsible for the well-pronounced maximum in the second graph 308 and the third graph 310 is in fact the binominial coefficient, which as explained above comes into play in 108 of the flow diagram 100 in FIG. 1 representing the method for determining test sets of operating parameter values for an electronic component in accordance with various embodiments.

Figure 4A:
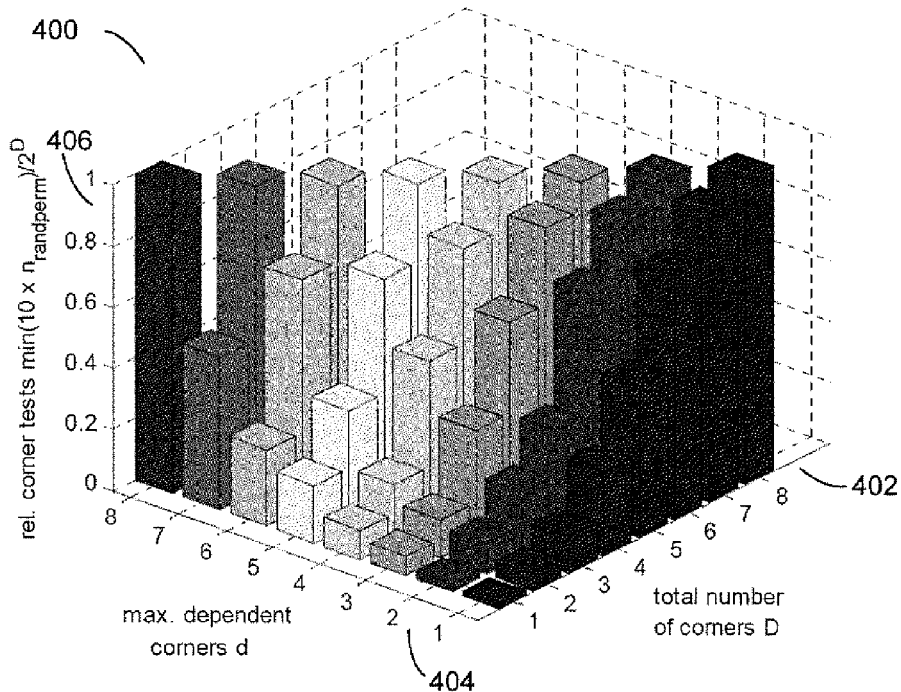
FIG. 4A and FIG. 4B show relative reductions of the number of test runs contained in test lists generated with the method in accordance with various embodiments.
Figure 4B:
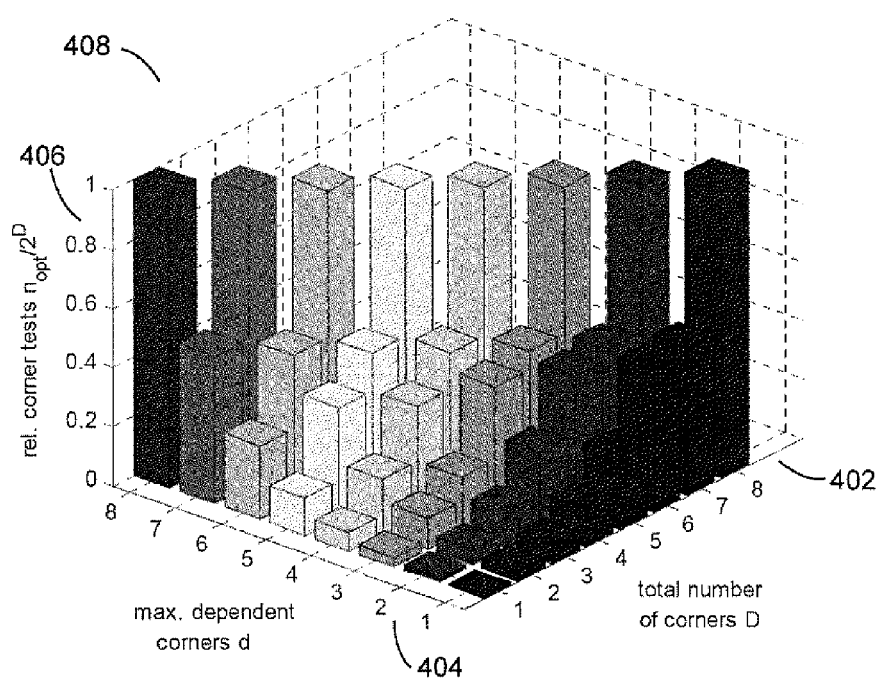

A comparison of the number of test runs contained in test lists generated with the method for determining test sets of operating parameter values for an electronic component in accordance with various embodiments to the number of test runs contained in exhaustive test lists is shown in FIG. 4A and FIG. 4B. In diagram 400 shown in FIG. 4A and in diagram 408 shown in FIG. 4B, the x-axis 402 denotes the number of operating parameters D, the y-axis 404 denotes the compression parameter, i.e. the dimension of subcorners. The z-axis 406 in FIG. 4A denotes the relative reduction of test runs contained in the result list in step 120 in the flow diagram 100 in FIG. 1 with respect to the total number of tests contained in the exhaustive test list, wherein a tenfold random permutation of the original exhaustive test matrix (or list) with respect to the rows is performed in the optimization 116. The z-axis 406 in FIG. 4B denotes the relative reduction of an optimum number of test runs $n_{opt}$ contained in a optimum result list with respect to the total number of tests contained in the exhaustive test list. In each of the bar diagrams, the height of a respective bar indicates the relative reduction of the number of test runs in a result test list obtained for a respective number of operating parameters D and the respective compression parameter d. As can be seen from the comparison of the height of the corresponding bars in both diagrams (height of the bars in diagram 408 in FIG. 4B is smaller than height of the bars in diagram 400 in FIG. 4A), the overall compression ratio in diagram 408 of FIG. 4B, which is based on the optimum number of test runs, is better than the compression ratio in diagram 400 of FIG. 4A. On the diagonal in both diagrams the relative reduction factors amount to 1 due to the inapplicability of the algorithm in those cases. On the diagonal the compression parameter d is equal to the total number of operating parameters D, i.e. the dimension of the subcorners and the dimension of corners or corner cases in the exhaustive test list are equal. In all other cases a drastic reduction of the number of test runs to be performed in compressed corner tests as compared to the number of test runs contained in the corresponding exhaustive corner test list can be observed. The smaller the compression parameter d, the greater the achievable reduction. For tests of semiconductor devices, typical compression parameters would lie between 2 and 6, for example, however, other numbers are possible as well.

In a further exemplary case, a compressed test list for D=19 operating parameters with k=2 operating parameter values each and with a compression factor of d=4 may include 118 test runs instead of $2^{19}$=524288 test runs included in the exhaustive test list. The compressed test list may therefore include a reasonable amount of test runs to be performed and may allow to reach a coverage of corner cases close to 100% within a feasible amount of test or simulation time.

In accordance with one implementation of the embodiment, a method for determining test sets of operating parameter values for an electronic component may be provided, wherein the method may include: determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determining a second set of reference sets, wherein the second set contains a union of sets, each set including all possible combinations of parameter values for the parameters of a respective intermediate set; selecting a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set.

In accordance with another implementation of the embodiment of the method, each parameter may have a plurality of parameter values.

In accordance with yet another implementation of the embodiment of the method, the at least one of the parameter values of each of the plurality of parameter values may correspond to a minimal rated value or a maximal rated value.

In accordance with yet another implementation of the embodiment of the method, the set of predefined sets may contain all possible combinations of the predefined number of parameter values for all parameters from the predefined parameter set.

In accordance with yet another implementation of the embodiment of the method, the set of predefined sets may contain a random selection of combinations from all possible combinations of the predefined number of parameter values for all parameters from the predefined parameter set.

In accordance with yet another implementation of the embodiment of the method, the first set may contain all possible combinations of the first number of parameters chosen from the predefined parameter set.

In accordance with yet another implementation of the embodiment of the method, the first set may contain a random selection of combinations from all possible combinations of the first number of parameters chosen from the predefined parameter set.

In accordance with yet another implementation of the embodiment of the method, the electronic component may include a semiconductor device. The semiconductor device may generally include all kinds of electronic circuits implemented on semiconductors, such as microprocessors, chip-based controllers.

In accordance with yet another implementation of the embodiment of the method, each of the parameters may be selected from a group including: supply voltage, input voltage, input voltage frequency, control voltage, control voltage, frequency, device temperature, input impedance, output impedance. However, various other parameters may be considered as the group of the parameters from which the parameters may be selected only depends on the electronic component.

In accordance with yet another implementation of the embodiment of the method, wherein selecting the second number of test sets out of the set of predefined sets may be performed iteratively until all reference sets from the second set are included in the union of the number of sets each including all possible combinations of the first number of parameter values for all parameters of the respective test sets selected so far.

According to further various embodiments, a method for testing an electronic component may be provided, the method including: performing the method for determining test sets of operating parameter values for an electronic component, the method including: determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determining a second set of reference sets, wherein the second set contains a union of sets, each set including all possible combinations of parameter values for the parameters of a respective intermediate set; selecting a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set; and performing the testing procedure, wherein combinations of the parameter values according to the selected test sets are used during the testing procedure.

According to yet further various embodiments, a device for determining test sets of operating parameter values for an electronic component may be provided, the device including: a processor configured to determine test sets of operating parameters for an electronic component, the processor being configured to: determine a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determine a second set of reference sets, wherein the second set contains a union of sets, each set including all possible combinations of parameter values for the parameters of a respective intermediate set; select a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set; and data storage circuitry configured to store the test sets determined by the processor.

In accordance with yet another implementation of the embodiment of the device, each parameter may have a plurality of parameter values.

In accordance with yet another implementation of the embodiment of the device, at least one of the parameter values of each of the plurality of parameter values may correspond to a minimal rated value or a maximal rated value.

In accordance with yet another implementation of the embodiment of the device, the set of predefined sets may contain all possible combinations of the predefined number of parameter values for all parameters from the predefined parameter set.

In accordance with yet another implementation of the embodiment of the device, the set of predefined sets may contain a random selection of combinations from all possible combinations of the predefined number of parameter values for all parameters from the predefined parameter set.

In accordance with yet another implementation of the embodiment of the device, the first set may contain all possible combinations of the first number of parameters chosen from the predefined parameter set.

In accordance with yet another implementation of the embodiment of the device, the first set may contain a random selection of combinations from all possible combinations of the first number of parameters chosen from the predefined parameter set.

In accordance with yet another implementation of the embodiment of the device, the electronic component may include a semiconductor device. The semiconductor device may generally include all kinds of electronic circuits implemented on semiconductors, such as microprocessors, chip-based controllers.

In accordance with yet another implementation of the embodiment of the device, each of the parameters may be selected from a group including: supply voltage, input voltage, input voltage frequency, control voltage, control voltage, frequency, device temperature, input impedance, output impedance. However, various other parameters may be considered as the group of the parameters from which the parameters may be selected only depends on the electronic component.

In accordance with yet another implementation of the embodiment of the device, the processor may be configured to select the second number of test sets out of the set of predefined sets is performed iteratively until all reference sets from the second set are included in the union of the number of sets each including all possible combinations of the first number of parameter values for all parameters of the respective test sets selected so far.

According to yet further various embodiments, a device for testing an electronic component may be provided, the device including: a controller configured to perform a test of an electronic component, the controller being configured to: perform the method for determining test sets of operating parameter values for an electronic component, the method including: determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determining a second set of reference sets, wherein the second set contains a union of sets, each set including all possible combinations of parameter values for the parameters of a respective intermediate set; selecting a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set; and perform the testing procedure, wherein combinations of the parameter values according to the selected test sets may be used during the testing procedure, wherein the controller may be further configured to generate signals corresponding to parameter values according to the selected test sets; an interface, wherein the interface may be connectable with the electronic component under test and is configured to output signals received from the controller.

In accordance with yet another implementation of the embodiment, the device may further include: the device for determining test sets of operating parameters for an electronic component, the device including: a processor configured to determine test sets of operating parameter values for an electronic component, the processor being configured to: determine a first set of intermediate sets, each intermediate set containing a combination of a first number of parameters chosen from a predefined parameter set containing a predefined number of parameters, wherein the parameters represent operating parameters of the electronic component and each parameter may have a number of parameter values; determine a second set of reference sets, wherein the second set contains a union of sets, each set including all possible combinations of parameter values for the parameters of a respective intermediate set; select a third set with a second number of test sets out of a set of predefined sets, wherein each predefined set includes a different combination of the parameter values for all parameters from the predefined parameter set, such that the second set is a subset of a union of a number of sets, each set including all possible combinations of the first number of parameter values for all parameters of a respective test set, wherein the number of the sets equals the second number of test sets within the third set; and data storage circuitry configured to store the test sets determined by the processor.

In accordance with yet another implementation of the embodiment of the device, the electronic component may include a semiconductor device.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A method for determining test sets of operating parameter values for an electronic component, the method comprising:
determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values;
determining a second set of reference sets, wherein the second set contains a union of sets, each set comprising all possible combinations of parameter values for the parameters of a respective intermediate set;
selecting a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set, wherein the number of the sets equals the second number of test sets within the third set.

2. The method of claim 1,
wherein each parameter has a plurality of parameter values.

3. The method of claim 2,
wherein at least one of the parameter values of each of the plurality of parameter values corresponds to a minimal rated value or a maximal rated value.

4. The method of claim 1,
wherein the set of predefined sets contains all possible combinations of the predefined number of parameter values for all parameters from the predefined parameter set.

5. The method of claim 1,
wherein the set of predefined sets contains a random selection of combinations from all possible combinations of the predefined number of parameter values for all parameters from the predefined parameter set.

6. The method of claim 1,
wherein the first set contains all possible combinations of the first number of parameters chosen from the predefined parameter set.

7. The method of claim 1,
wherein the first set contains a random selection of combinations from all possible combinations of the first number of parameters chosen from the predefined parameter set.

8. The method of claim 1,
wherein the electronic component comprises a semiconductor device.

9. The method of claim 8,
wherein each of the parameters can be selected from a group comprising:
supply voltage;
input voltage;
input voltage frequency;
control voltage;
control voltage frequency;
device temperature;
input impedance;
output impedance.

10. The method of claim 1,
wherein selecting the second number of test sets out of the set of predefined sets is performed iteratively until all reference sets from the second set are included in the union of the number of sets each comprising all possible combinations of the first number of parameter values for all parameters of the respective test sets selected so far.

11. A method for testing an electronic component, the method comprising:
determining test sets of operating parameter values for an electronic component by:
determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values;
determining a second set of reference sets, wherein the second set contains a union of sets, each set comprising all possible combinations of parameter values for the parameters of a respective intermediate set;
selecting a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set, wherein the number of the sets equals the second number of test sets within the third set; and
performing a testing procedure, by applying combinations of the parameter values according to the selected test sets to the electronic component.

12. A device for determining test sets of operating parameter values for an electronic component, the device comprising:
a processor configured to:
determine a first set of intermediate sets, each intermediate set containing a combination of a first number of parameters chosen from a predefined parameter set containing a predefined number of parameters, wherein the parameters represent operating parameters of the electronic component and each parameter may have a number of parameter values;
determine a second set of reference sets, wherein the second set contains a union of sets, each set comprising all possible combinations of parameter values for the parameters of a respective intermediate set;

select a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set, wherein the number of the sets equals the second number of test sets within the third set; and data storage circuitry configured to store the test sets determined by the processor.

13. The device of claim 12,
wherein each parameter has a plurality of parameter values.

14. The device of claim 12,
wherein at least one of the parameter values of each of the plurality of parameter values corresponds to a minimal rated value or a maximal rated value.

15. The device of claim 12,
wherein the set of predefined sets contains all possible combinations of the predefined number of parameter values for all parameters from the predefined parameter set.

16. The device of claim 12,
wherein the set of predefined sets contains a random selection of combinations from all possible combinations of the predefined number of parameter values for all parameters from the predefined parameter set.

17. The device of claim 12,
wherein the first set contains all possible combinations of the first number of parameters chosen from the predefined parameter set.

18. The device of claim 12,
wherein the first set contains a random selection of combinations from all possible combinations of the first number of parameters chosen from the predefined parameter set.

19. The device of claim 12,
wherein the electronic component comprises a semiconductor device.

20. The device of claim 19,
wherein each of the parameters can be selected from a group comprising:
supply voltage;
input voltage;
input voltage frequency;
control voltage;
control voltage frequency;
device temperature;
input impedance;
output impedance.

21. The device of claim 12,
wherein the processor is configured to select the second number of test sets out of the set of predefined sets is performed iteratively until all reference sets from the second set are included in the union of the number of sets each comprising all possible combinations of the first number of parameter values for all parameters of the respective test sets selected so far.

22. A device for testing an electronic component, the device comprising:
a controller configured to perform a test of an electronic component, the controller being configured to:
determine test sets of operating parameter values for an electronic component by:
determining a first set of intermediate sets, each intermediate set containing a combination of a first number of parameters chosen from a predefined parameter set containing a predefined number of parameters, wherein the parameters represent operating parameters of the electronic component and each parameter may have a number of parameter values;
determining a second set of reference sets, wherein the second set contains a union of sets, each set comprising all possible combinations of parameter values for the parameters of a respective intermediate set;
selecting a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set, wherein the number of the sets equals the second number of test sets within the third set; and
perform a testing procedure, by applying combinations of the parameter values according to the selected test sets to the electronic component,
wherein the controller is further configured to generate signals corresponding to parameter values according to the selected test sets;
an interface, wherein the interface is connectable with the electronic component under test and is configured to output signals received from the controller.

23. The device of claim 22, further comprising:
the device for determining test sets of operating parameters for an electronic component, the device comprising:
a processor configured to determine test sets of operating parameter values for an electronic component, the processor being configured to:
determine a first set of intermediate sets, each intermediate set containing a combination of a first number of parameters chosen from a predefined parameter set containing a predefined number of parameters, wherein the parameters represent operating parameters of the electronic component and each parameter may have a number of parameter values;
determine a second set of reference sets, wherein the second set contains a union of sets, each set comprising all possible combinations of parameter values for the parameters of a respective intermediate set;
select a third set with a second number of test sets out of a set of predefined sets, wherein each predefined set comprises a different combination of the parameter values for all parameters from the predefined parameter set, such that the second set is a subset of a union of a number of sets, each set comprising all possible combinations of the first number of parameter values for all parameters of a respective test set, wherein the number of the sets equals the second number of test sets within the third set; and
data storage circuitry configured to store the test sets determined by the processor.

24. The device of claim 22,
wherein the electronic component comprises a semiconductor device.

25. The device of claim 23,
wherein the electronic component comprises a semiconductor device.

* * * * *